(12) United States Patent
Nguyen et al.

(10) Patent No.: US 7,977,705 B2
(45) Date of Patent: Jul. 12, 2011

(54) LOW-COST SUBSTRATES HAVING HIGH-RESISTIVITY PROPERTIES AND METHODS FOR THEIR MANUFACTURE

(75) Inventors: Bich-Yen Nguyen, Austin, TX (US); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 201 days.

(21) Appl. No.: 12/470,152

(22) Filed: May 21, 2009

(65) Prior Publication Data

US 2009/0321873 A1    Dec. 31, 2009

Related U.S. Application Data

(60) Provisional application No. 61/093,887, filed on Sep. 3, 2008.

(30) Foreign Application Priority Data

Jun. 30, 2008 (FR) ...................... 08 03696

(51) Int. Cl.
*H01L 29/02* (2006.01)

(52) U.S. Cl. ........ 257/169; 257/218; 257/364; 257/523; 257/E29.152; 438/141; 438/354; 438/478

(58) Field of Classification Search .................. 257/169, 257/212, 218, 264, 364, 523, 646, 656, 154, 257/194, 195, E29.152; 438/141, 354, 403, 438/478
See application file for complete search history.

(56) References Cited

U.S. PATENT DOCUMENTS

| | | | |
|---|---|---|---|
| 4,300,150 A | 11/1981 | Colak | 357/23 |
| 4,771,016 A | 9/1988 | Bajor et al. | 438/455 |
| 5,399,507 A | 3/1995 | Sun | 437/24 |
| 5,750,000 A | 5/1998 | Yonehara et al. | 156/630.1 |
| 5,773,151 A | 6/1998 | Begley et al. | 428/446 |
| 6,063,713 A | 5/2000 | Doan | 438/763 |
| 6,140,163 A | 10/2000 | Gardner et al. | 438/157 |
| 6,166,411 A | 12/2000 | Buynoski | 257/347 |
| 6,221,732 B1 | 4/2001 | Kaneko | 438/405 |
| 6,391,744 B1 | 5/2002 | Hudak et al. | 438/459 |
| 6,538,916 B2 | 3/2003 | Ohsawa | 365/149 |
| 6,645,795 B2 | 11/2003 | Muller et al. | 438/149 |

(Continued)

FOREIGN PATENT DOCUMENTS

DE    42 32 844 A1    3/1994

(Continued)

OTHER PUBLICATIONS

Search Report of French Patent Application No. 0803696.

(Continued)

*Primary Examiner* — Evan Pert
*Assistant Examiner* — Scott Wilson
(74) *Attorney, Agent, or Firm* — Winston & Strawn LLP

(57) ABSTRACT

In one embodiment, the invention provides substrates that are structured so that devices fabricated in a top layer thereof have properties similar to the same devices fabricated in a standard high resistivity substrate. Substrates of the invention include a support having a standard resistivity, a semiconductor layer arranged on the support substrate having a high-resistivity, preferably greater than about 1000 Ohms-cm, an insulating layer arranged on the high-resistivity layer, and a top layer arranged on the insulating layer. The invention also provides methods for manufacturing such substrates.

20 Claims, 5 Drawing Sheets

U.S. PATENT DOCUMENTS

| | | | |
|---|---|---|---|
| 6,646,307 B1 | 11/2003 | Yu et al. | 257/347 |
| 6,664,598 B1 | 12/2003 | Dennard et al. | 257/347 |
| 6,812,527 B2 | 11/2004 | Dennard et al. | 257/347 |
| 6,815,296 B2 | 11/2004 | Dennard et al. | 438/283 |
| 6,826,320 B2 | 11/2004 | Deliwala | 385/14 |
| 6,946,373 B2 | 9/2005 | Agnello et al. | 438/509 |
| 6,955,971 B2 | 10/2005 | Ghyselen et al. | 438/406 |
| 7,018,873 B2 | 3/2006 | Dennard et al. | 438/149 |
| 7,089,515 B2 | 8/2006 | Hanafi et al. | 716/4 |
| 7,102,206 B2 | 9/2006 | Hidaka et al. | 257/618 |
| 7,221,038 B2 | 5/2007 | Auberton-Herve | 257/618 |
| 7,273,785 B2 | 9/2007 | Dennard et al. | 438/262 |
| 7,358,166 B2 | 4/2008 | Agnello et al. | 438/509 |
| 7,387,946 B2 | 6/2008 | Dao | 438/458 |
| 7,417,288 B2 | 8/2008 | Dennard et al. | 257/365 |
| 7,422,958 B2 | 9/2008 | Kostrzewa et al. | 438/406 |
| 7,883,990 B2 | 2/2011 | Levy et al. | 438/459 |
| 2002/0170487 A1 | 11/2002 | Zehavi et al. | 117/84 |
| 2003/0039439 A1 | 2/2003 | Deliwala | 385/30 |
| 2003/0057487 A1 | 3/2003 | Yamada et al. | 257/347 |
| 2004/0079993 A1 | 4/2004 | Ning et al. | 257/347 |
| 2004/0150067 A1 | 8/2004 | Ghyselen et al. | 257/506 |
| 2004/0171232 A1 | 9/2004 | Cayrefourcq et al. | 438/458 |
| 2004/0256700 A1 | 12/2004 | Doris et al. | 257/627 |
| 2005/0112845 A1 | 5/2005 | Ghyselen et al. | 438/455 |
| 2005/0205930 A1 | 9/2005 | Williams | 257/347 |
| 2006/0016387 A1 | 1/2006 | Yokoyama et al. | 117/84 |
| 2006/0125013 A1 | 6/2006 | Rim | 257/351 |
| 2006/0154442 A1 | 7/2006 | de Souza et al. | 438/455 |
| 2006/0166451 A1 | 7/2006 | Raskin et al. | 438/311 |
| 2006/0264004 A1 | 11/2006 | Tong et al. | 438/455 |
| 2006/0276004 A1 | 12/2006 | Dai | 438/455 |
| 2007/0032040 A1* | 2/2007 | Lederer | 438/455 |
| 2007/0138558 A1 | 6/2007 | Saitoh | 257/350 |
| 2007/0190681 A1 | 8/2007 | Lee et al. | 438/54 |
| 2008/0029815 A1 | 2/2008 | Chen et al. | 257/347 |
| 2008/0054352 A1 | 3/2008 | Imoto et al. | 257/330 |
| 2008/0079123 A1 | 4/2008 | Kostrzewa et al. | 257/635 |
| 2008/0105925 A1 | 5/2008 | Pae et al. | 257/347 |
| 2008/0124847 A1 | 5/2008 | Sudo | 438/152 |
| 2008/0153313 A1 | 6/2008 | Kononchuk | 438/795 |
| 2010/0127345 A1* | 5/2010 | Sanders et al. | 257/528 |

FOREIGN PATENT DOCUMENTS

| | | |
|---|---|---|
| FR | 2 906 078 A1 | 3/2008 |
| FR | 2 910 702 A1 | 6/2008 |
| JP | 08124827 | 5/1996 |
| WO | WO 2004/100268 A1 | 11/2004 |
| WO | WO 2005/031842 A1 | 4/2005 |

OTHER PUBLICATIONS

Rajkumar et al., "Effects of Nitrogen Plasma Immersion Ion Implantation in Silicon," Engineering Thin Films With Ion Beams, Nanoscale Diagnostics, and Molecular Manufacturing, Proceedings of the SPIE, vol. 4468, pp. 131-139 (2001).

Disney, "SOI Smart IGBT with Low Cost and High Performance," IEEE International Symposium on Power Semiconductor Devices and IC's, May 1997, pp. 289-292.

Maleville et al., "Multiple SOI layers by multiple Smart Cut® transfers," IEEE International SOI Conference, Oct. 2000, pp. 134-135.

Yang et al., "High Performance CMOS Fabricated on Hybrid Substrate With Different Crystal Orientations," International Electron Devices Meeting, Dec. 2003, pp. 18.7.1-18.7.3.

"Controlled, Varying Depth Etching for VIA Holes and for Variable Conductor Thickness," IBM Technical Disclosure Bulletin, 31(7): 81-82 (Dec. 1988).

International Search Report and Written Opinion of the International Searching Authority, application No. PCT/US2009/044810, Jan. 13, 2010.

H. Nagano et al., XP009097417, "SOI/Bulk Hybrid Wafer Fabrication Process Using Selective Epitaxial Growth (SEG) Technique for High-End SoC Applications", Japanese Journal of Applied Physics, vol. 42, No. 4B, pp. 1882-1886 (2003).

International Search Report, application No. PCT/US2009/044365, Jul. 16, 2009.

International Search Report, application No. PCT/US2009/044372, Jul. 10, 2009.

French Preliminary Search Report, FA 709339, FR 0803700, dated May 11, 2009.

French Preliminary Search Report, FA 709128, FR 0803676 dated Feb. 2, 2009.

Search Report of French Patent Application No. 0803697 dated Feb. 17, 2009.

Search Report of French Patent Application No. 0803701 dated Feb. 18, 2009.

International Search Report, and Written Opinion of the International Searching Authority, application No. PCT/US2009/044825, Jan. 13, 2010.

Restriction Requirement, U.S. Appl. No. 12/470,253, dated Jul. 12, 2010.

Non-Final Office Action, U.S. Appl. No. 12/470,253, dated Aug. 3, 2010.

Non-Final Office Action, U.S. Appl. No. 12/470,253, dated Dec. 9, 2010.

Non-Final Office Action, U.S. Appl. No. 12/469,436, dated Jan. 25, 2011.

* cited by examiner

LOW-COST SUBSTRATES HAVING HIGH-RESISTIVITY PROPERTIES AND METHODS FOR THEIR MANUFACTURE

This application claims the benefit of application No. 61/093,887 filed Sep. 3, 2008, the entire content of which is expressly incorporated herein by reference thereto.

BACKGROUND OF THE INVENTION

The present invention relates to substrates structured so that devices fabricated in a top layer thereof have properties similar to the same devices fabricated in a standard high resistivity substrate, and to methods of manufacturing such substrates.

BACKGROUND OF THE INVENTION

Examples of known substrates with high electrical resistivity "HR" substrates are disclosed in documents US 2006/0166451 and US 2007/0032040. Such known substrates generally comprise a top layer in which or on which high frequency devices will be formed, an insulating layer below the top layer and a high-resistivity support. In some instances, additional layers could be inserted between the insulating layer and the support to further improve the high electrical resistivity properties of the substrate.

Although known HR substrates are suitable for devices with improved performance because they provide reduced signal loss in the support or improved signal to noise ratio due to reduced crosstalk, they suffer from a major drawback: their cost can be high. This is partly due to the fact that known HR substrates incorporate high-resistivity supports that are priced at an elevated cost compared to traditional, non HR, supports. High cost is a particular concern when substrates will be used for fabrication of devices to be integrated into price sensitive products, such as consumer products telecom markets The higher cost of HR supports often arises because their manufacture requires additional steps. In case of mono-crystalline silicon, such additional steps often involve multi-step and lengthy annealing to precipitate residual oxygen present in the support. Such additional steps can also include, e.g., forming an additional layer in-between the insulating layer and the support, or removing a surface layer of the support to further increase or preserve the high-resistivity of the substrate, or so forth.

SUMMARY OF THE INVENTION

The present invention provides high-resistivity "HR" substrates—that is substrates structured so that devices fabricated in a top layer thereof have properties similar to the same devices fabricated in a standard high resistivity substrate—that are simpler to manufacture and of lower cost than known HR substrates. HR substrates of this invention have applications in microelectronics, optoelectronics, photovoltaics, micro-electro mechanical devices, and particularly in devices that operate at high frequency typically over 100 Mhz, such as radio frequency devices that can be found in telecommunication or radio detection applications.

In general, the invention replaces known, higher-cost HR substrates with lower-cost, HR substrates comprising a top layer and a support. Instead of relying on high-resistivity of the support to provide high-resistivity of the final substrate, the invention provides high-resistivity of the final substrate by means of a support with a surface layer of a lower-cost, high-resistivity semiconductor material. Accordingly, the support can have standard resistivity, and optionally lower quality, and thus can be of lower cost. The invention also provides low-cost methods for manufacturing HR substrates.

In more detail, the invention provides substrates having high-resistivity properties that include a support having a standard resistivity, a high-resistivity semiconductor layer on the support substrate, an insulating layer on the high-resistivity layer, and a top layer on the insulating layer. The high-resistivity semiconductor layer can have a resistivity greater than 1000 Ohm/cm. Optionally, the provided substrates further include a diffusion barrier layer arranged between the support and the semiconductor layer.

The invention also provides methods for manufacturing a substrate having high-resistivity properties. The methods include providing a support presenting a standard resistivity, forming a high-resistivity semiconductor layer on the support substrate to form a first intermediate structure, providing an insulating layer on the first intermediate structure, assembling the intermediate structure with a donor substrate to form a second intermediate structure, and finally reducing the thickness of the donor substrate of the second intermediate structure to form the substrate. Optionally, methods of the invention further include providing a diffusion barrier layer on the support before the step of forming the high-resistivity semiconductor layer.

BRIEF DESCRIPTION OF THE DRAWINGS

Other features and advantages of the invention will become apparent from the following descriptions that refer to the appended drawings, which illustrate exemplary but non-limiting embodiments of the invention, and in which.

DETAILED DESCRIPTION OF PREFERRED EMBODIMENTS

The preferred embodiments and particular examples described herein should be seen as examples of the scope of the invention, but not as limiting the present invention. The scope of the present invention should be determined with reference to the claims.

Figure 1:
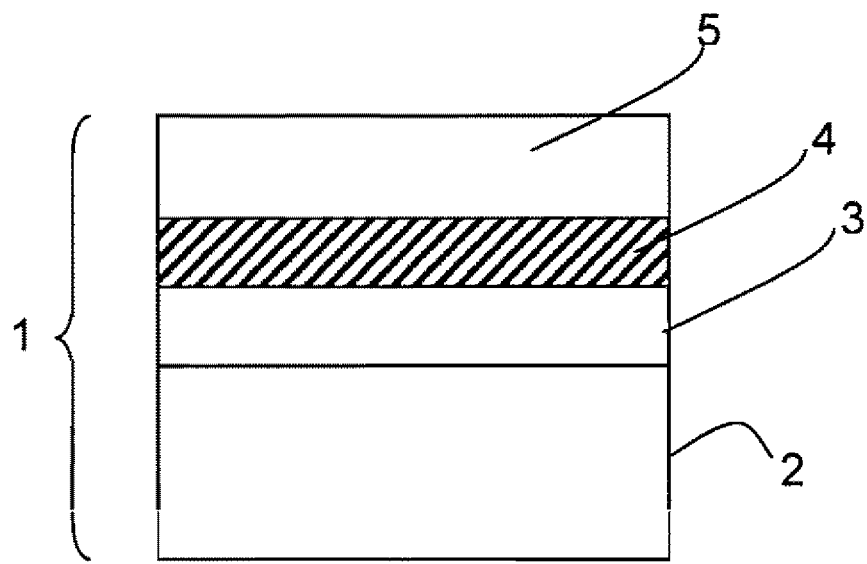
FIG. 1 illustrates an embodiment of the substrates of the invention.

FIG. 1 illustrates embodiments according to the invention of substrates 1 structured so that devices fabricated in a top layer thereof have properties similar to the same devices fabricated in a standard high resistivity substrate. These substrates of the invention are also more simply referred to herein as "HR substrates". The substrate 1 can have a diameter depending on its final application of, e.g., 300 mm, 200 mm, or other diameters.

Substrate 1 comprises top layer 5, in which or on which devices are ultimately formed. In some cases, devices, e.g., known CMOS devices, can be formed according to known techniques directly on and in top layer 5. In other cases, e.g., gallium nitride HEMT devices, further layers (not illustrated in FIG. 1) are provided on top layer 5. The top layer can comprise various materials chosen according to device application, e.g., mono-crystalline silicon, silicon carbide, gallium nitride, and the like. The thickness of the top layer 5 can also be chosen according to device application, need, and manufacturing capability, but typically varies between about 10 nm and about 1 micron. It is noted that the thickness of top layer 5 does not affect the HR properties of substrate 1.

HR substrate 1 also comprises insulating layer 4 on which top layer 5 is arranged. Insulating layer 4 commonly comprises silicon dioxide, since this material can be easily formed either by deposition or by oxidation of a silicon substrate. The insulating layer can also comprise silicon nitride, high k dielectric materials, low k dielectric materials, or a combination of layers such materials. The thickness of the insulating layer can be from a few nm, to 10 nm, to 100 nm, up to 200 nm, or other thicknesses.

HR substrate 1 also comprises support 2 which, in contrast to what is known in the prior art, has a standard resistivity. A standard resistivity support is one that has not been designed to provide HR properties and therefore has a resistivity that is standard or normal for that particular type of support and doping level. For example, standard or normal resistivity can be between about 8 Ohm-cm and about 30 Ohm-cm. Such standard-resistivity supports cost less than HR supports, and further, can be selected to have economical crystalline properties or other features. For example, supports can comprise quartz, poly-crystalline silicon, poly-crystalline silicon carbide, poly-crystalline aluminium nitride, and the like. It can also be a reclaimed silicon wafer that has been used in preceding manufacturing steps.

HR substrate 1 also comprises high-resistivity semiconductor layer 3 arranged on top of the support substrate but below insulating layer 4. As the high-resistivity of substrate 1 arises primarily from the high-resistivity of semiconductor layer 3, it is preferred that the HR semiconductor layer has sufficient resistivity and sufficient thickness so that the resistivity of substrate 1 is suitable to its intended application. In preferred embodiments, HR semiconductor layer 3 has a resistivity greater than about $10^3$ Ohms-cm, or more preferably greater than about $10^4$ Ohm-cm, and a thickness between about 20 nm and 5000 nm.

HR semiconductor layer 3 preferably comprises amorphous silicon having high-resistivity by virtue of a lack of doping (or lack of intentional doping), e.g., having concentrations of either p-type or n-type dopants that are preferably less than about $5 \times 10^{12}/cm^3$. Optionally, the resistivity of this layer can be enhanced by doping with nitrogen species at a density of, e.g., between $10^{13}/cm^3$ to $10^{15}/cm^3$. Amorphous silicon layers are preferred since they can be provided at low-cost and on many types of supports. HR semiconductor layer 3 can also comprise poly-crystalline silicon, or less preferably, mono-crystalline silicon.

Figure 2:
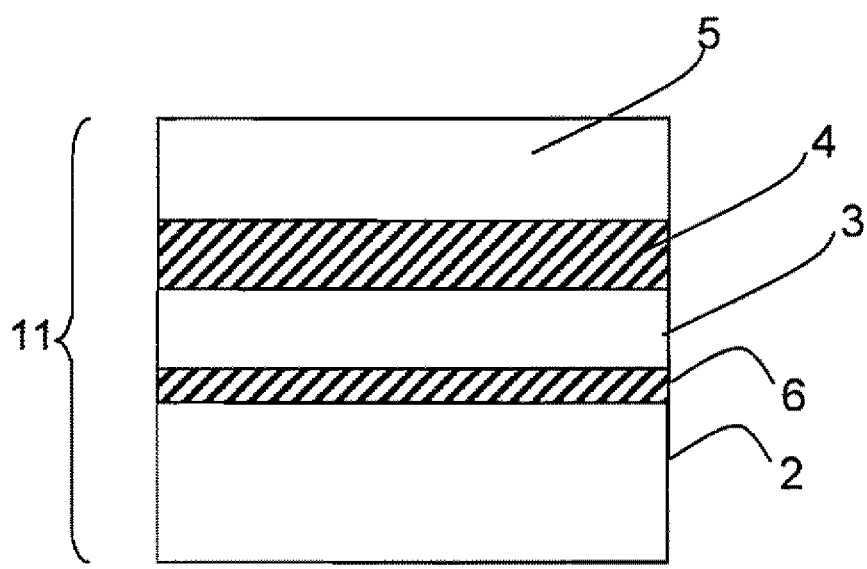
FIG. 2 illustrates another embodiment of the substrates of the invention.

FIG. 2 illustrates another embodiment of HR substrate 11 of the invention which comprises several elements that are similar to corresponding elements of the prior embodiments. Similar elements include: support 2 having a standard or normal resistivity, high-resistivity semiconductor layer 3 arranged on the support substrate and having a resistivity preferably greater than $10^3$ Ohms-cm, insulating layer 4 arranged on high-resistivity layer 2, and top layer 5 arranged on the insulating layer. Prior descriptions of these elements are not repeated here.

In contrast to the prior embodiments, HR substrate 11 also comprises diffusion barrier layer 6 on top of support 2 but below high-resistivity semiconductor layer 3.

The diffusion barrier avoids or limits the diffusion of contaminants or dopants from the support into the HR semiconductor layer that would be likely to reduce its high-resistivity. Such a contaminants. Diffusion barrier layer 6 can comprise single or multiple layers of silicon dioxide, silicon nitride, combinations of these materials, or other materials, and can have a thickness of at least 20 nm. In preferred embodiments, diffusion barrier layer 6 comprises nitride rich silicon nitride, e.g., $Si_XN_Y$ that incorporates more nitrogen atoms than stoichiometric, e.g., $Si_3N_4$, silicon nitride. Nitride rich silicon nitride, for instance formed by chemical vapour deposition that can be plasma assisted, is known to be both a diffusion barrier and a high-resistivity dielectric.

It should be understood that diffusion of dopants and contaminants from the top layer 5 into the high-resistivity semiconductor layer 3 is similarly limited or prevented by insulating layer 4, and can be even further reduced by selecting appropriate materials for this layer. For instance, insulating layer 4 can comprise a nitride-rich silicon nitride layer that can act as an efficient diffusion barrier layer.

Diffusion barrier layer 6 of this preferred embodiment has advantages beyond simply acting to effectively prevent diffusion of dopants or contaminants into high-resistivity semiconductor layer 3. This diffusion barrier layer is also a high-resistivity dielectric that can contribute to the high-resistivity of the substrate, and can form a source of N species that can migrate into the high-resistivity semiconductor layer 3 and further increase its resistivity.

FIGS. 3a to 3e illustrate embodiments of methods for manufacturing substrates 1 of the invention.

Figure 3A:
FIGS. 3a to 3e illustrates an embodiment of methods for manufacturing substrates.

FIG. 3a illustrates initial support 2 having standard resistivity, which can comprise, e.g., a mono-crystalline silicon wafer having a resistivity between about 8 Ohms-cm and about 30 Ohms-cm.

Figure 3B:
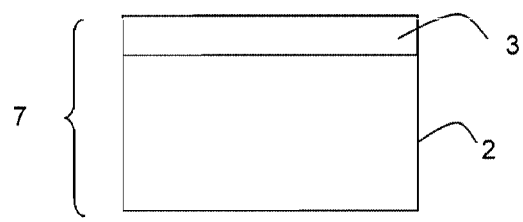

FIG. 3b illustrates a next step which forms first intermediate structure 7 by placing and/or forming high-resistivity semiconductor layer 3 on support 2. HR semiconductor layer 3 can be formed by, e.g., depositing an undoped amorphous or poly-crystalline silicon layer on the support 2 by means of chemical vapour deposition or physical vapour deposition.

Figure 3C:
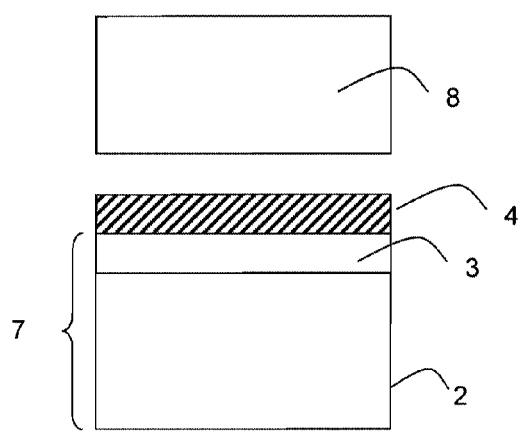
Figure 3D:
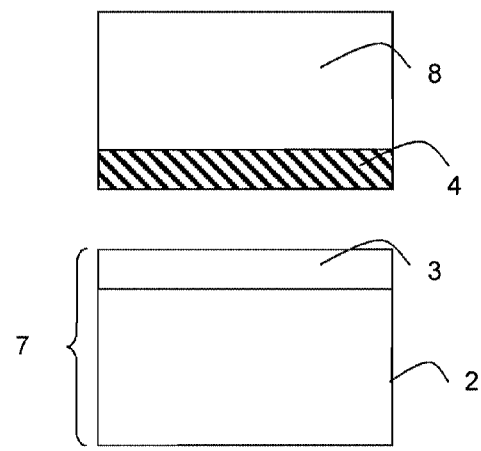

FIGS. 3c and 3d illustrate alternatives for the next step which forms and/or places insulating layer 4 on first intermediate structure 7. The alternative illustrated in FIG. 3c includes forming insulating layer 4 by depositing insulation material on HR semiconductor layer 3 of the first intermediate structure, or by oxidizing undoped silicon HR semiconductor layer 3 should this layer comprises silicon.

Figure 3E:
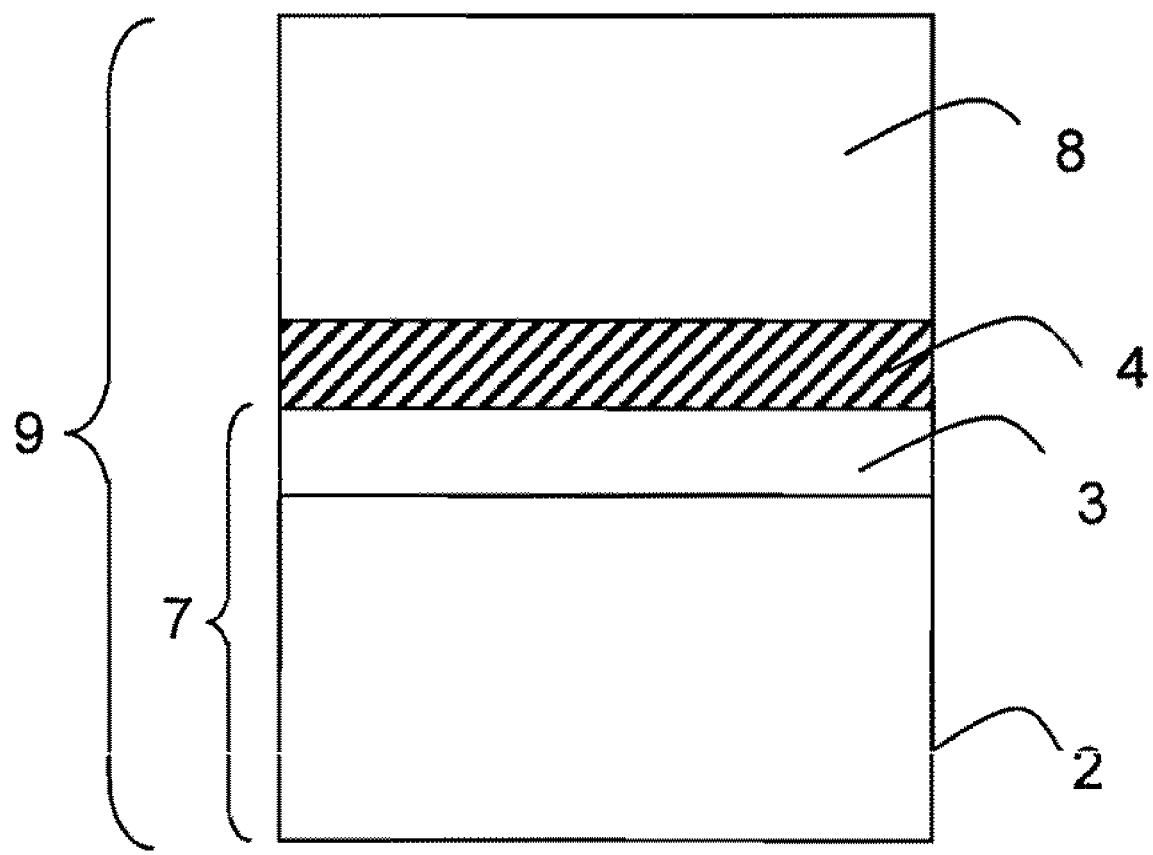

The alternative illustrated in FIG. 3d first forms insulating layer 4 primarily on or in donor substrate 8, and second, places insulating layer 4 on first intermediate structure 7 during assembly of first intermediate structure 7 with donor substrate 8 to form second intermediate structure 9 FIG. 3e. Optionally, donor substrate 8 can initially comprise a surface insulating layer.

FIG. 3e illustrates a further step which bonds first intermediate structure 7 and donor substrate 8 to form second intermediate structure 9. In the alternative of FIG. 3c, first intermediate structure 7 already has surface insulating layer 4; while in the alternative of FIG. 3d, the donor substrate 8 has surface insulating layer 4. Bonding of donor substrate 8 to first intermediate structure 7 can optionally be facilitated by, before the step of assembling, a further step of polishing the exposed surface of intermediate structure 7 and/or of the substrate 8 and/or of insulating layer 4.

In a final step not illustrated, the thickness of donor substrate 8 of second intermediate structure 9 is reduced to form final substrate 1 by known thickness reducing techniques, e.g., grind and etch back techniques, Smart Cut® techniques (that perform ion implantation and fracture), or other techniques.

During the steps of assembling and/or reducing the thickness, it can be advantageous to apply thermal treatments.

Although such treatments can transform the nature of high-resistivity semiconductor layer 3, e.g., from an amorphous layer as initially deposited into a poly-crystalline layer 3 after thermal treatment, the high-resistivity is this layer is not expected to be substantially changed.

FIGS. 4a to 4f illustrate embodiments of methods for manufacturing HR substrate 11, which as described, comprises diffusion barrier layer 6 on top of support 2 but under HR semiconductor layer 3. The present embodiment has similarities to the prior embodiment, e.g., the nature of the materials, the resistivity level of the materials, and an optional step polishing before assembly. Prior descriptions of these steps are not repeated here.

Figure 4A:
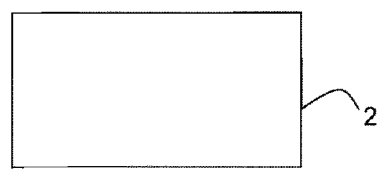
FIG. 4a to 4f illustrates another embodiment of methods for manufacturing substrates.

FIG. 4a illustrates initial support 2 having standard resistivity.

Figure 4B:

FIG. 4b illustrates a next step in which diffusion barrier layer 6 is formed and/or placed on support 2, preferably by chemical vapour deposition (optionally plasma enhanced) of a nitride rich silicon nitride material. Diffusion barrier layer 6 allows more flexibility in the manufacturing process.

Figure 4C:
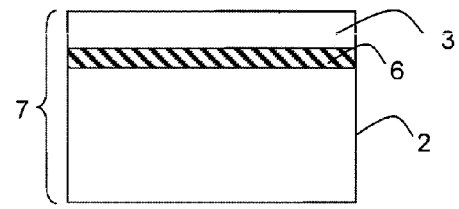

FIG. 4c illustrates a further step of forming and/or placing HR semiconductor layer 3 on diffusion barrier layer 6.

Figure 4D:
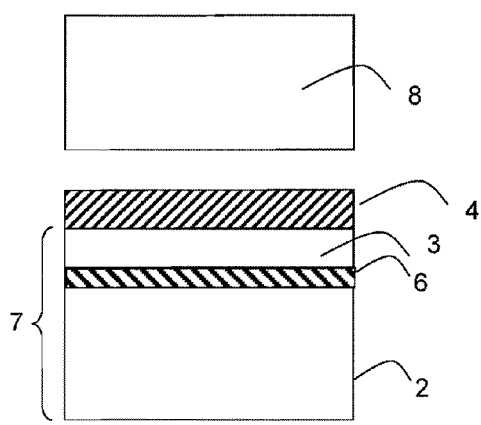
Figure 4E:
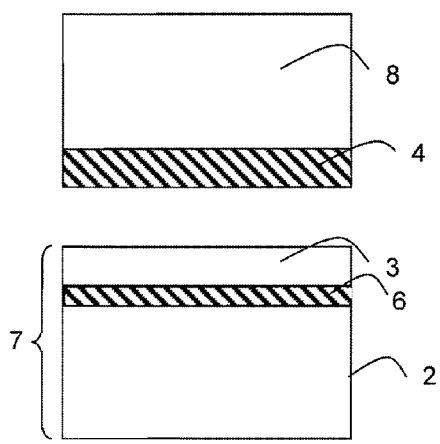

FIGS. 4d and 4e illustrate alternative steps for forming and/or placing insulating layer 4 on HR semiconductor layer 3. These steps are similar to the steps illustrated in FIGS. 3c and 3d and the corresponding prior descriptions are not repeated here.

Figure 4F:
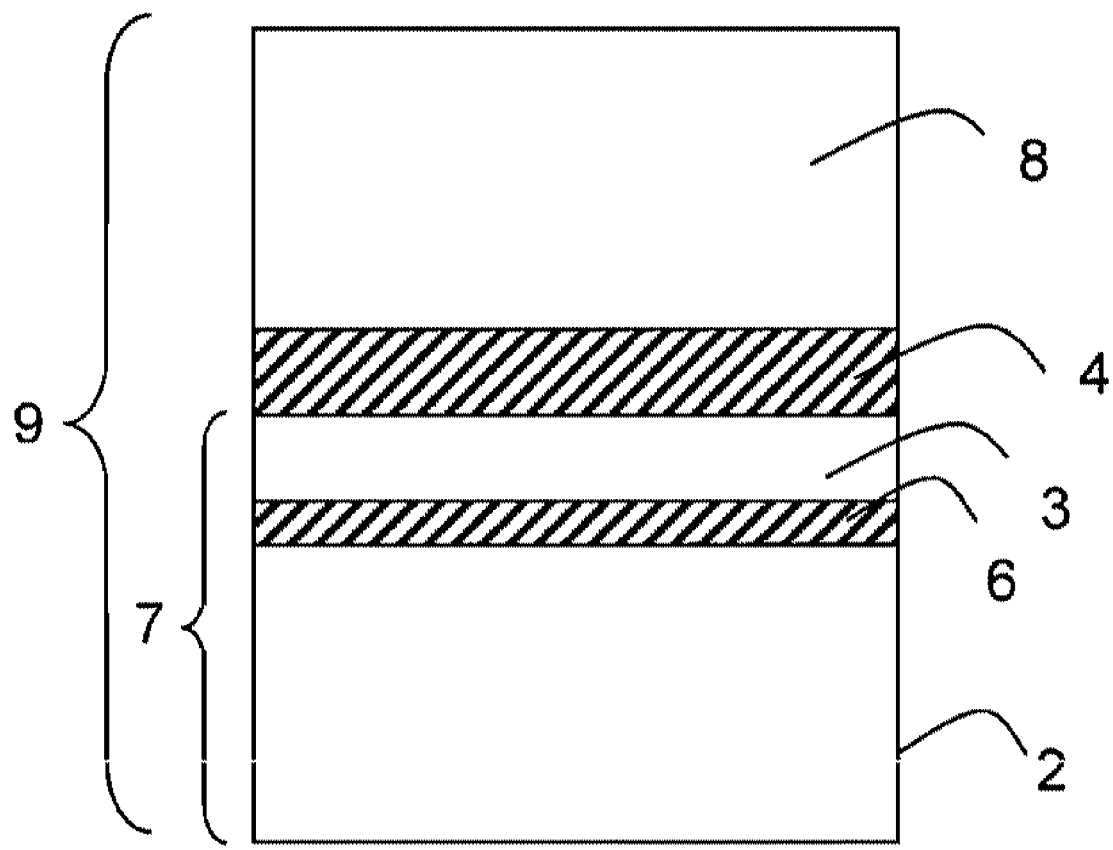

FIG. 4f illustrates a further step in which the intermediate structure is assembled with donor substrate 8 to form a second intermediate structure 9.

In a final step (not illustrated), the thickness of donor substrate 8 of second intermediate structure 9 is reduced to form final substrate 11 by known thickness reducing techniques.

Optionally, the resistivity of HR semiconductor layer 3 can be further increased by introducing nitrogen species into that layer by, e.g., forming diffusion barrier layer 6 that is nitrogen rich so nitrogen species can migrate into high-resistivity layer 3 during processing, or by implanting nitrogen species, e.g., nitrogen ions, through top layer 5 and insulating layer 4. A preferred concentration of nitrogen species is between $10^{13}/cm^3$ to $10^{15}/cm^3$.

What is claimed is:

1. A method of manufacturing a substrate having high-resistivity (HR) properties for devices fabricated therein, the method comprising:
   providing a support having a first resistivity of standard resistivity;
   providing an HR semiconductor layer on the support, the HR layer having a thickness between 20 nm and 5000 nm and a resistivity that is greater than the first resistivity of the support;
   providing an insulating layer having a thickness between 10 nm and 200 nm on the HR semiconductor layer or at the surface of a donor substrate;
   assembling the support with the donor substrate; and
   reducing the thickness of the donor substrate portion.

2. The method of claim 1 wherein the first resistivity is between 8 Ohm-cm and 30 Ohm-cm, and wherein the resistivity of the HR semiconductor layer is greater than $10^3$ to $10^4$ Ohm-cm.

3. The method of claim 1 wherein providing the HR semiconductor layer further comprises depositing an undoped silicon layer.

4. The method of claim 1 further comprising implanting nitrogen ions into the HR semiconductor layer.

5. The method of claim 1 wherein providing the insulating layer further comprises one or more of depositing the insulating layer and oxidizing the HR semiconductor layer or the surface of the donor substrate.

6. The method of claim 1 wherein the insulating layer is provided at the surface of the donor substrate; and wherein the step of assembly further comprises bringing into contact the support with the insulating layer at the surface of the donor substrate.

7. The method of claim 1 further comprising providing a diffusion barrier layer having a thickness greater than 20 nm on the support before the step of providing the HR semiconductor layer.

8. The method of claim 1 further comprising fabricating one or more electronic devices in the top semiconductor layer, the fabricated devices having HR properties comprising one or more of reduced signal loss and improved signal to noise ratio when operated at frequencies greater than 0.1 GHz.

9. A substrate having high-resistivity (HR) properties for devices fabricated therein, the substrate comprising:
   a support having a first resistivity of standard resistivity;
   a HR semiconductor layer arranged on the support, the layer having a resistivity that is greater than the first resistivity of the support;
   an insulating layer arranged on the HR semiconductor layer; and
   a top semiconductor layer arranged on the insulating layer and suitable for device fabrication.

10. The substrate of claim 9 wherein the first resistivity is between 8 Ohm-cm and 30 Ohm-cm, and wherein the resistivity of the HR semiconductor layer is greater than $10^3$ to $10^4$ Ohm-cm.

11. The substrate of claim 9 wherein the support comprises one or more of quartz, mono-crystalline silicon, poly-crystalline silicon, poly-crystalline silicon carbide, or poly-crystalline aluminium nitride.

12. The substrate of claim 9 wherein the HR semiconductor layer comprises one or more of undoped amorphous silicon or undoped poly-crystalline silicon.

13. The substrate of claim 9 wherein the HR semiconductor layer further comprises nitrogen species at a concentration of between $10^{13}$ and $10^{15}/cm^3$.

14. The substrate of claim 9 wherein the thickness of the HR semiconductor layer is between 20 nm and 5000 nm.

15. The substrate of claim 9 further comprising a diffusion barrier layer having a thickness greater than 20 nm arranged between the support and the HR semiconductor layer.

16. The substrate of claim 9 wherein the insulating layer has a thickness between 10 nm and 200 nm and comprises one or more of silicon dioxide, silicon nitride, a high k dielectric material, a low k dielectric material, or silicon oxide.

17. The substrate of claim 9 wherein the top layer comprises mono-crystalline silicon.

18. The substrate of claim 9 further comprising one or more electronic devices fabricated in the top semiconductor layer.

19. The substrate of claim 9 wherein the HR properties comprises one or more of reduced signal loss and improved signal to noise ratio when devices fabricated therein operate at frequencies greater than 0.1 GHz.

20. A substrate having high-resistivity (HR) properties for devices fabricated therein, the substrate comprising:
a support having a first resistivity of standard resistivity;
a HR semiconductor layer arranged on the support, the layer having a resistivity that is greater than the first resistivity of the support;
a diffusion barrier layer comprising one or more layers comprising silicon dioxide, nitride rich silicon nitride, and silicon nitride arranged between the support and the HR semiconductor layer;
an insulating layer arranged on the HR semiconductor layer; and
a top semiconductor layer arranged on the insulating layer and suitable for device fabrication.

* * * * *